(12) United States Patent
Gustavsson

(10) Patent No.: US 11,955,789 B2
(45) Date of Patent: Apr. 9, 2024

(54) SUPPLY UNIT FOR ELECTROMAGNETICALLY SHIELDED AND BURGLARPROOF ROOMS

(71) Applicant: CESIUM AB, Katrineholm (SE)

(72) Inventor: Jack Gustavsson, Katrineholm (SE)

(73) Assignee: CESIUM AB, Katrineholm (SE)

( * ) Notice: Subject to any disclaimer, the term of this patent is extended or adjusted under 35 U.S.C. 154(b) by 102 days.

(21) Appl. No.: 17/910,011

(22) PCT Filed: Mar. 5, 2021

(86) PCT No.: PCT/SE2021/050201
§ 371 (c)(1),
(2) Date: Sep. 8, 2022

(87) PCT Pub. No.: WO2021/183028
PCT Pub. Date: Sep. 16, 2021

(65) Prior Publication Data
US 2023/0129775 A1  Apr. 27, 2023

(30) Foreign Application Priority Data
Mar. 12, 2020 (SE) .................... 2030077-8

(51) Int. Cl.
*H05K 9/00* (2006.01)
*H02G 3/22* (2006.01)

(52) U.S. Cl.
CPC ............. *H02G 3/22* (2013.01); *H05K 9/0001* (2013.01); *H05K 9/009* (2013.01)

(58) Field of Classification Search
CPC .................................................. H05K 9/0001
See application file for complete search history.

(56) References Cited

U.S. PATENT DOCUMENTS

| 4,941,207 A | * | 7/1990 | Maeda | H04B 7/24 |
| | | | | 455/523 |
| 5,043,529 A | * | 8/1991 | Vanesky | H05K 9/0001 |
| | | | | 174/363 |
| 10,194,566 B2 | | 1/2019 | Johansson | |

(Continued)

FOREIGN PATENT DOCUMENTS

| DE | 3711937 C1 | 7/1988 |
| EP | 2598696 B1 | 6/2018 |

(Continued)

OTHER PUBLICATIONS

International Search Report (Mar. 16, 2021) for corresponding International App. PCT/SE2021/050201.

*Primary Examiner* — Hung V Ngo
(74) *Attorney, Agent, or Firm* — WRB-IP LLC

(57) ABSTRACT

A supply unit for electromagnetically shielded rooms is provided where the supply unit includes a passthrough unit and is designed to be arranged entirely or partly beneath the electromagnetically shielded room, and where an entrance is situated at a first side of the passthrough unit and an exit is situated at a second side of the passthrough unit, and where the exit is designed to be arranged at the floor of the electromagnetically shielded room, and where the passthrough unit is designed with at least one passthrough arranged in concrete.

10 Claims, 3 Drawing Sheets

(56) References Cited

U.S. PATENT DOCUMENTS

| | | | | |
|---|---|---|---|---|
| 2011/0088940 A1* | 4/2011 | Nordling | ............. | H05K 9/0001 |
| | | | | 174/382 |
| 2012/0015555 A1* | 1/2012 | Deimel | ............... | H05K 9/0018 |
| | | | | 439/607.41 |
| 2020/0404814 A1* | 12/2020 | Hector, Jr. | ........... | H05K 9/0003 |

FOREIGN PATENT DOCUMENTS

| | | |
|---|---|---|
| SE | 504073 C2 | 11/1996 |
| WO | 2012012845 A1 | 2/2012 |

\* cited by examiner

SUPPLY UNIT FOR ELECTROMAGNETICALLY SHIELDED AND BURGLARPROOF ROOMS

BACKGROUND AND SUMMARY

The invention relates to a supply unit for electromagnetically shielded rooms.

Electromagnetically shielded rooms, such as rooms designed for electromagnetic measurements or rooms designed to be protected against external electromagnetic interference or rooms designed not to emit electromagnetic signals and/or information, are designed with various arrangement in order to supply the room, for example, with electric power or intake air.

The technical solutions which are known, such as air filters of various kinds, bring with them a technical vulnerability in terms of burglary, since they are often arranged relatively unprotected.

Patent DE 3 711 937 C1 shows an example of a conventional arrangement for a passthrough of electrical and electromagnetic shielding where cables, tubes, and other supply lines pass through walls and ceilings into rooms and/or parts of buildings shielded against electric fields. Electrically conductive elastic modules are press-fitted around the supply lines. The patent does not describe a passthrough for a burglarproof room.

Patent EP 2 598 696 B1 shows a shielded arrangement for a modular-design conduit system which is arranged below the ground level in an urban environment containing a stormwater system and power lines for infrastructure solutions. The patent document does not show any arrangement or technical solutions for supplying a shielded and burglarproof room.

Further problems which the invention proposes to solve will emerge in connection with the following detailed specification of the various embodiments.

The present invention, according to an aspect thereof, improves the possibility of supplying an electromagnetically shielded room, for example with intake air, electric power, etc., in a way which does not entail any decrease in the protection against burglary of the shielded room.

The present invention, according to an aspect thereof, relates to a supply unit for electromagnetically shielded rooms where the supply unit comprises a passthrough unit and is designed to be arranged entirely or partly beneath the electromagnetically shielded room, and where an entrance is situated at a first side of the passthrough unit and an exit is situated at a second side of the passthrough unit, and where the exit is designed to be arranged at the floor of the electromagnetically shielded room, and where the passthrough unit is designed with at least one passthrough arranged in concrete.

According to further aspects for the improved supply unit;
the passthrough is arranged for all or a selection of intake air, exhaust air, drainage, liquid lines, gas lines, power lines and/or signal lines.
the passthrough is an electrically conductive tube.
the passthrough unit is arranged with an electrically conducting metal plate.
the entrance and/or the exit is arranged with a filter structure.
the entrance and/or the exit is filled with electrically conductive granules.
the supply unit is entirely or partially arranged with electrically conductive panels.
the concrete is electrically conductive in that the concrete is arranged with at least one additive from the group of carbon fiber, metal fiber, metal netting and/or electrically conductive composite fiber.
at least one connection cable is arranged in the passthrough unit and connectors are arranged on the passthrough unit and the connectors are arranged at the connection cable.
the electrically conductive materials in the supply unit are electrically arranged at the shielded room and electrically arranged at electrical grounding.

Thanks to the proposed technical solution for a supply unit it is possible to solve the previous problems relating to the bringing in and taking out of fluids, such as air or water, and/or cables, such as those for signals or power supply, while at the same time a complete electromagnetic shielding can be maintained and the burglary risks are minimized or eliminated entirely, since the supply unit is arranged entirely or partially beneath the ground surface and is situated entirely or partially beneath the shielded room. Moreover, the supply unit is protected by the construction with reinforced concrete against forcing and/or penetrating.

BRIEF DESCRIPTION OF THE DRAWINGS

The invention shall be described more closely in the following with reference to the enclosed figures, where.

DETAILED DESCRIPTION

Electromagnetically shielded rooms preferably comprise an electrically conductive shell, such as metal panels which are assembled in electrically conductive manner so that no electromagnetic radiation can pass through the shell. The electrical shell can be placed at electrical grounding. The electrically conductive shell can also be produced by arranging structural elements, such as reinforced concrete, with additives to make them electrically conductive, such as the addition of carbon fibers, metal fibers, metal netting, and/or electrically conductive composite fibers, and/or in combination with the placement of reinforcing irons.

Electromagnetic shielding may be designed to include a measurement chamber, for example, in order to perform electromagnetic measurements, such as EMC measurements. Electromagnetic shielding may also be provided to protect equipment from external electromagnetic radiation such as radio jamming or electromagnetic weapons (EMP—ElectroMagnetic Pulse) or from nuclear created electromagnetic pulses (NEMP—Nuclear EMP). Moreover, electromagnetic shielding may be designed to prevent compromising signals from leaving a building, for example, to ensure that unauthorized persons cannot gain access to the information, this being known as compromising signal protection. All electronic equipment generates electromagnetic signals which can be sent out in the air or in the electrical grid or otherwise leave the electronic equipment. Equipment such as a computer keyboard, equipment with microprocessors, or a monitor screen generates unintentional signals which with the right equipment can be intercepted and processed into information unbeknownst to the user. Arranging the electronic equipment in a shielded room may stop possibly compromising signals from leaving the room, or alternatively the compromising signals can be greatly dampened.

In most cases, it is desirable for a supply line to provide, for example, intake air, fluid lines, gas lines, power lines and/or signal lines to the shielded room. In the same way, outgoing air, drainage, fluid lines, gas lines, power lines and/or signal lines may need to be taken out from the shielded room.

Conventionally, a number of technical solutions exist for establishing a passthrough into a shielded room in an electromagnetically shielded manner. However, these passthroughs are only of such kind that a possible burglary attempt or other effort to penetrate the electromagnetically shielded room is not prevented. By arranging the passthrough partly underneath the electrically shielded room, for example with wave traps, and partly such that the passthrough runs through a passthrough unit comprising concrete, an electromagnetic shielding can be established, while at the same time maintaining a high level of protection against intrusion.

Figure 1:
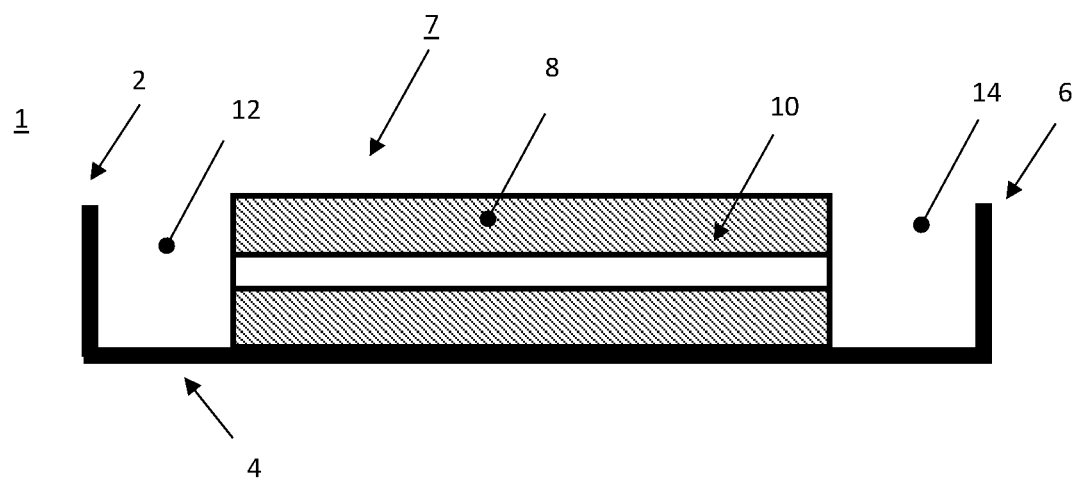
FIG. 1 shows a supply unit according to one embodiment of the invention in a side view.

FIG. 1 shows a supply unit 1 in a side view, comprising a first side wall 2, a bottom plate 4, a second side wall 6 and a passthrough unit 7 having at least one passthrough 10 surrounded by and encased in concrete 8. An entrance 12 and an exit 14 are situated on either side of the passthrough unit 7. The concrete 8 is preferably reinforced concrete and it can be arranged with additives to make it electrically conductive, such as additives of carbon fiber, metal fiber, metal netting and/or electrically conductive composite fiber. The concrete may also be arranged with additives to improve its ability to withstand mechanical processing, for example by adding particles or components comprising fibers, such as wood fibers or glass fibers. Moreover, various metals or ceramics may be added to improve the resistance of the concrete 8 to mechanical processing.

The passthrough 10 is preferably electrically conductive and configured as a tube with preferably circular cross section, but may also have other geometrical shapes. The passthrough 10 may be situated in an electrically conductive material or an electrically insulating material, or parts of the passthrough 10 may be electrically conductive and another part is electrically insulating. In the event that the passthrough 10 is electrically conductive, it will act as a wave trap and be dimensioned to meet the need of the shielded room for dampening. A wave trap may have the shape of a metallic sleeve around an opening which is in principle a waveguide with such dimensions in relation to the wavelength that it dampens, instead of guiding, the emanating signals. As compared to an empty wave trap, fiber optic cables through a wave trap can bring about less dampening of emanating signals with frequencies in the GHz range, depending on whether the material in the fiber cables has different electric properties than the air present in an empty wave trap. Cables are arranged preferably with surrounding shielding where the cable passes into the passthrough 10 and out from the passthrough 10, for example, by partly removing the outer insulating sleeve of the cable so that the shield on the cable can be arranged electrically at the passthrough 10. The passthrough 10 can also be arranged electrically at grounding.

Figure 2:
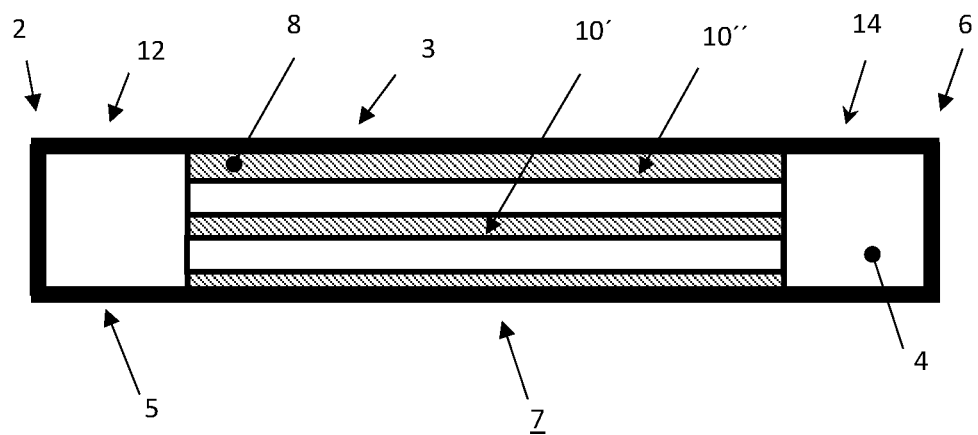
FIG. 2 shows a supply unit according to one embodiment of the invention in a top view.

FIG. 2 shows a supply unit 1 in a top view, comprising a first side wall 2, a bottom plate 4, a second side wall 6, a third side wall 3, and a fourth side wall 5, plus a passthrough unit 7 having at least one passthrough 10', 10" surrounded by and encased in concrete 8. Preferably, there are multiple passthroughs, FIG. 2 showing a first passthrough 10', as well as a second passthrough 10". An entrance 12 is situated at a first side of the passthrough unit 7 and an exit 14 is situated at a second side of the passthrough unit 7. The passthrough unit 7, the first side wall 2, the bottom plate 4, the second side wall 6, the third side wall 3, and the fourth side wall 5 are preferably made in a unit cast in concrete. The passthrough unit 7, the first side wall 2, the bottom plate 4, the second side wall 6, the third side wall 3, and the fourth side wall 5 may furthermore be electrically conductive, or arranged with an electrically conductive panel on the outside or the inside of the respective unit.

Figure 3:
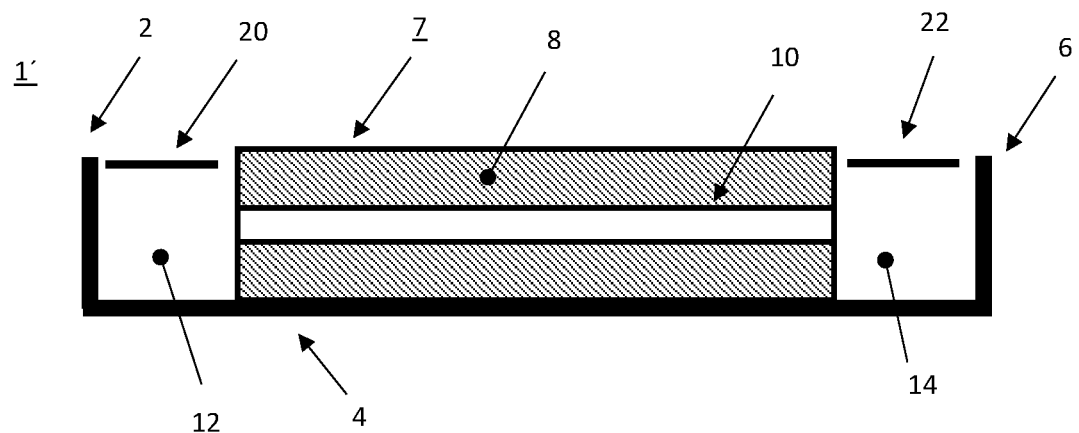
FIG. 3 shows a supply unit according to an alternative embodiment of the invention in a side view.

FIG. 3 shows an alternative embodiment of a supply unit 1' where at least one filter unit 20, 22 is arranged at the entrance 12 and/or exit 14. The filter unit can be made of electromagnetic dampening filters of the honeycomb type, also known as honeycomb filters, honeycomb grilles, honeycomb waveguides, shielded air grilles, radar grilles, ventilation grilles or vent panels. Moreover, the filter unit 20, 22 can be designed as other filter types suitable for the particular area of application. For example, the filter unit 20, 22 can be made of electrically conductive polymer arranged between passthroughs for possible cables.

Figure 4:
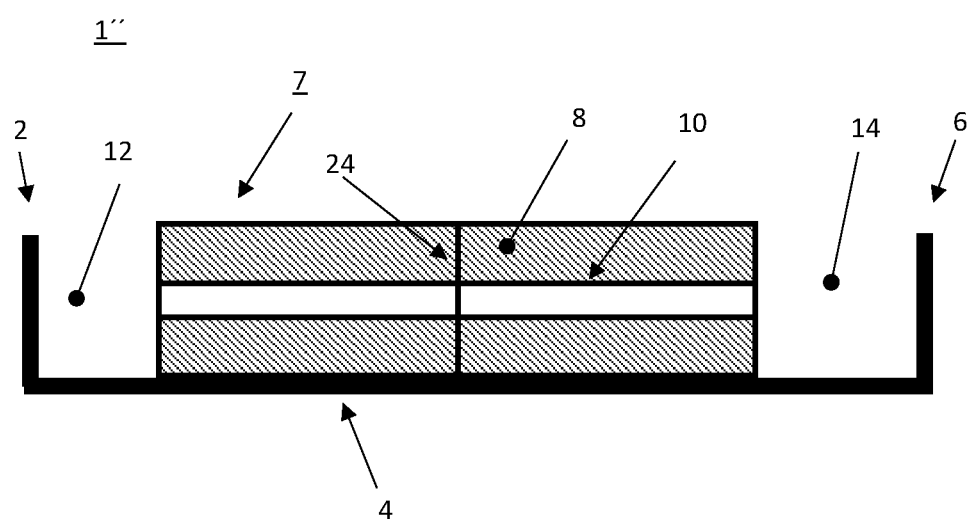
FIG. 4 shows a supply unit according to an alternative embodiment of the invention in a side view.

FIG. 4 shows an alternative embodiment of a supply unit 1" where at least one metal plate 24 is arranged on the supply unit 1" between the entrance 12 and the exit 14. Passthroughs 10 run through the metal plate 24 and are electrically situated at the metal plate 24. The metal plate 24 shields any electric signals propagating between the entrance 12 and the exit 14 and furthermore acts as protection against possible attempts at penetration or otherwise working on the passthrough unit 7.

Figure 5:
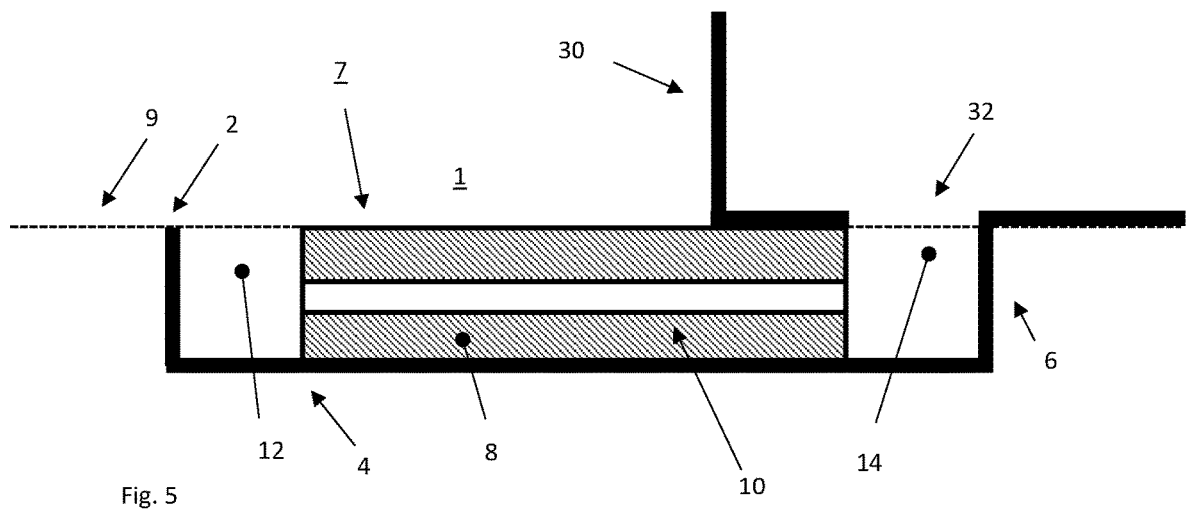
FIG. 5 shows a supply unit situated beneath a shielded room according to an embodiment of the invention in a side view.

FIG. 5 shows a supply unit 1 arranged at a shielded room 30 where the supply unit 1 is situated beneath the ground surface 9. The exit 14 is arranged such that the exit encounters an intake 32 arranged in the shielded room 30. Intake air and exhaust air, for example, can be arranged through the supply unit 1. Moreover, different forms of signal cables, such as optical or electrical cables going to and from the shielded room 30, can be arranged through the supply unit 1. Moreover, electric power, water, and drainage for example can be arranged for the shielded room 30 through the supply unit 1. Intake air and exhaust air can furthermore be arranged through the aforementioned honeycomb filter, and various forms of conduit can be shielded and/or arranged so as to be electrically coupled to the passthrough 10 in order to eliminate the possibility of electromagnetic signals leaving and/or coming into the shielded room 30. Moreover, electrically conductive balls or granules can be arranged in the cavity for the entrance 12 and/or exit 14 in order to electrically shield the entrance 12 and exit 14. Examples of granules are copper balls of the type used in supply cables for a conventional shielded room. Moreover, signal filters and power filters can be arranged in the supply unit, if need be.

Figure 6:
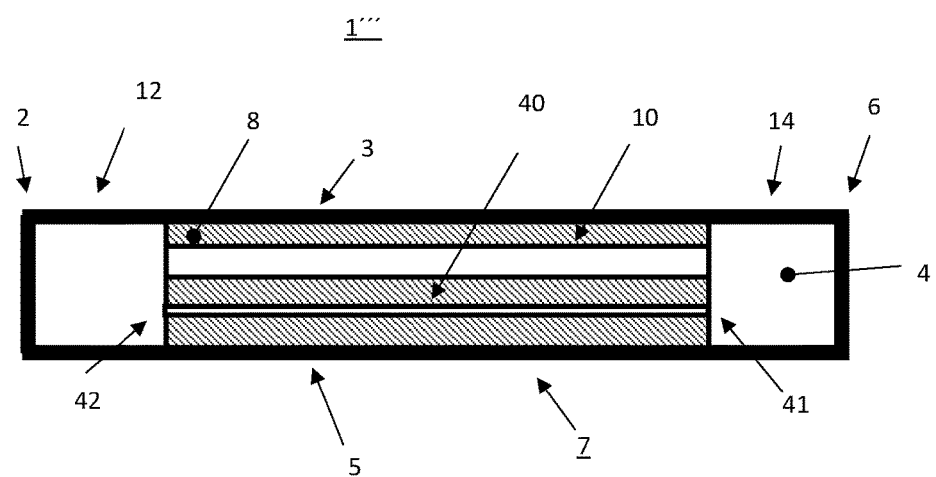
FIG. 6 shows a supply unit according to an alternative embodiment of the invention in a top view.

FIG. 6 shows an alternative embodiment of a supply unit 1''' in a top view, comprising a first side wall 2, a bottom plate 4, a second side wall 6, a third side wall 3, and a fourth side wall 5, as well as a passthrough unit 7 having at least one passthrough 10 surrounded by and encased in concrete 8. The passthrough unit 7, the first side wall 2, the bottom plate 4, the second side wall 6, the third side wall 3, and the fourth side wall 5 are preferably made in a unit cast in concrete. The passthrough unit 7, the first side wall 2, the bottom plate 4, the second side wall 6, the third side wall 3, and the fourth side wall 5 may furthermore be electrically conductive, or arranged with an electrically conductive panel on the outside or the inside of the respective unit. Furthermore, a connection cable 40 such as a shielded signal cable or an optical cable can be cast in the passthrough unit 7 and be arranged with connectors 41, 42 at either end, one at the entrance 12 and one at the exit 14 of the connection cable 40. Thus, a cable can be arranged in the entrance 12 at the connector 42 of the connection cable 40 and in the same way a cable can be arranged in the exit 14 at the connector 41 of the connection cable 40 for further connection to the shielded room.

The invention is not limited to the specially indicated embodiments, but rather it can be varied in different ways within the scope of the patent claims.

Besides the connection for bringing in and taking out of fluids, such as air, gas, or water, and/or cables, such as those for signals or power supply, other requirements may also be satisfied with the described supply unit, such as those in regard to a connection to and from a shielded room.

Moreover, other materials can be utilized, for example, the supply unit can be made of a polymer, metal, or other material.

Moreover, the supply unit can be configured in a different way, the basic concept being the arrangement of a passthrough unit. Regarding other walls, some or all of the walls may be removed from the supply unit, depending on the design solution.

Moreover, the supply unit may be designed as an integrated part of the shielded room.

The invention claimed is:

1. A supply unit for electromagnetically shielded rooms, wherein the supply unit comprises a passthrough unit and is designed to be arranged entirely or partly beneath the electromagnetically shielded room, and where an entrance is situated at a first side of the passthrough unit and an exit is situated at a second side of the passthrough unit, and where the exit is designed to be arranged at the floor of the electromagnetically shielded room, and where the passthrough unit is designed with at least one passthrough arranged in concrete.

2. The supply unit for electromagnetically shielded rooms according to claim 1, wherein the passthrough is arranged for all or a selection of intake air, exhaust air, drainage, liquid lines, gas lines, power lines and/or signal lines.

3. The supply unit for electromagnetically shielded rooms according to claim 1 wherein the passthrough is an electrically conductive tube.

4. The supply unit for electromagnetically shielded rooms according to claim 3, wherein the electrically conductive materials in the supply unit are electrically arranged at the shielded room and electrically arranged at electrical grounding.

5. The supply unit for electromagnetically shielded rooms according to claim 1, wherein the passthrough unit is arranged with an electrically conducting metal plate.

6. The supply unit for electromagnetically shielded rooms according to claim 1, wherein the entrance and/or the exit is arranged with a filter structure.

7. The supply unit for electromagnetically shielded rooms according to claim 1, wherein the entrance and/or the exit is filled with electrically conductive uranules.

8. The supply unit for electromagnetically shielded rooms according to claim 1, wherein the supply unit is entirely or partially arranged with electrically conductive panels.

9. The supply unit for electromagnetically shielded rooms according to claim 1, wherein the concrete is electrically conductive in that the concrete is arranged with at least one additive from the group of carbon fiber, metal fiber, metal netting and/or electrically conductive composite fiber.

10. The supply unit for electromagnetically shielded rooms according to claim 1, wherein the at least one connection cable is arranged in the passthrough unit and connectors are arranged on the passthrough unit and in that the connectors are arranged at the connection cable.

* * * * *